(12) United States Patent
Dekkers et al.

(10) Patent No.: US 11,702,731 B2
(45) Date of Patent: Jul. 18, 2023

(54) METHOD FOR FORMING A FILM OF AN OXIDE OF IN, GA, AND ZN

(71) Applicant: IMEC VZW, Leuven (BE)

(72) Inventors: Hendrik F. W. Dekkers, Tienen (BE); Jose Ignacio del Agua Borniquel, Bertem (BE)

(73) Assignees: IMEC vzw, Leuven (BE); Applied Materials Inc., Santa Clara, CA (US)

( * ) Notice: Subject to any disclaimer, the term of this patent is extended or adjusted under 35 U.S.C. 154(b) by 0 days.

(21) Appl. No.: 17/105,183

(22) Filed: Nov. 25, 2020

(65) Prior Publication Data
US 2021/0164091 A1    Jun. 3, 2021

(30) Foreign Application Priority Data
Nov. 28, 2019   (EP) ...................................... 19212086

(51) Int. Cl.
    *C23C 14/08*    (2006.01)
    *C23C 14/34*    (2006.01)
    *C23C 14/35*    (2006.01)

(52) U.S. Cl.
    CPC ........ *C23C 14/3414* (2013.01); *C23C 14/086* (2013.01); *C23C 14/35* (2013.01)

(58) Field of Classification Search
    CPC .............. C23C 14/0042; C23C 14/086; C23C 14/3414; C23C 14/3421; C23C 14/3485; C23C 14/35; H01J 37/3426; H01J 37/3429; H01L 29/66969
    USPC .................................................... 204/192.29
    See application file for complete search history.

(56) References Cited

U.S. PATENT DOCUMENTS

| | | | |
|---|---|---|---|
| 8,129,719 B2 * | 3/2012 | Yamazaki | ......... H01L 29/78693 257/43 |
| 8,569,192 B2 | 10/2013 | Kuramochi et al. | |
| 9,045,823 B2 | 6/2015 | Osada et al. | |
| 2014/0241978 A1 | 8/2014 | Yamazaki et al. | |

(Continued)

FOREIGN PATENT DOCUMENTS

| JP | 2014-192264 | * | 6/2014 |
| KR | 1020130021621 | | 3/2013 |
| WO | WO 2019/026954 | | 7/2019 |

OTHER PUBLICATIONS

Machine Translation JP 2014-192264 (Year: 2014).*

(Continued)

*Primary Examiner* — Rodney G McDonald
(74) *Attorney, Agent, or Firm* — Knobbe, Martens, Olson & Bear, LLP

(57) ABSTRACT

A method for forming a film of an oxide of In, Ga, and Zn, having a spinel crystalline phase comprises providing a substrate in a chamber; providing a sputtering target in said chamber, the target comprising an oxide of In, Ga, and Zn, wherein: In, Ga, and Zn represent together at least 95 at % of the elements other than oxygen, In represents from 0.6 to 44 at % of In, Ga, and Zn, Ga represents from 22 to 66 at % of In, Ga, and Zn, and Zn represents from 20 to 46 at % of In, Ga, and Zn; and forming a film on the substrate, the substrate being at a temperature of from 125° C. to 250° C., by sputtering the target with a sputtering gas comprising $O_2$, the sputtering being performed at a sputtering power of at least 200 W.

16 Claims, 3 Drawing Sheets

(56) References Cited

U.S. PATENT DOCUMENTS

2015/0034475 A1 2/2015 Yamazaki et al.
2019/0024227 A1 1/2019 Yamazaki et al.

OTHER PUBLICATIONS

Shimomura et al., "Crystallography of excimer laser-crystallized In—Ga—Zn—O film," 2013 Twentieth International Workshop on Active-Matrix Flatpanel Displays and Devices (AM-FPD), 2013, pp. 155-158. (Year: 2013).*
Shimomura, et al. "Crystallography of eximer laser-crystallized In—Ga—Zn—O film", 2013 Twentieth International Workshop on Active-Matrix Flatpanel Displays and Devices (AM-FPD), JSAP Jul. 2, 2013, pp. 155-158, XP032494335.
Hsu, et al. "Investigation of the High Mobility IGZO Thin Films by Using Co-Sputtering Method", Materials 2015, 8, 2769-2781; doi:10.3390/ma8052769.
Takenaka, et al. "Influence of deposition condition on electrical properties of a-IGZO films deposited by plasma-enhanced reactive sputtering", Journal of Alloys and Compounds 772 (2019) 642e649.
Aman et al. "Low-temperature (150 ° C.) activation of Ar+O2+H2-sputtered In—Ga—Zn—O for thin-film transistors", 2018 Appl. Phys. Express 11 081101.
Extended European Search Report dated May 13, 2020 for European Application No. 19212086.3 in 12 pages.

* cited by examiner

METHOD FOR FORMING A FILM OF AN OXIDE OF IN, GA, AND ZN

INCORPORATION BY REFERENCE TO RELATED APPLICATION

Any and all priority claims identified in the Application Data Sheet, or any correction thereto, are hereby incorporated by reference under 37 CFR 1.57. This application claims the benefit of European Patent Application No. EP 19212086.3, filed Nov. 28, 2019. The aforementioned application is incorporated by reference herein in its entirety, and is hereby expressly made a part of this specification.

TECHNICAL FIELD OF THE INVENTION

The present invention relates to the field of semiconducting materials and more specifically to a film of an oxide of In, Ga, and Zn and to a method for making the same.

BACKGROUND OF THE INVENTION

InGaZnO$_4$ (IGZO) is a conductive transparent oxide typically deposited by physical vapor deposition (PVD). IGZO has a low off-state current ($I_{off}$) and moderate mobility. This makes it a good candidate for forming field effect devices in relatively low-temperature Front-End-Of-Line (FEOL) and Back-End-Of-Line (BEOL) process sequences. Such a material allows the integration of electrical interconnects with electrical switching on top of front-end-of-line (FEOL) devices. Also, the low off-current behavior (<1×10$^{-21}$ A/µm) of this material opens the possibility of its integration in various memory applications. Depending on the conditions used for its formation, so far, IGZO has been obtained in an amorphous phase, in a so-called C-axis aligned crystalline (CAAC) phase, or in mixtures thereof. The CAAC phase is characterized by having a repeated structure when seen from the c-axis direction and has ordered InO planes with distances equal to those found in (poly-)crystalline hexagonal structures. The CAAC phase is amorphous when seen from the direction perpendicular to the c-axis.

The CAAC phase is advantageous because its structure is close to hexagonal crystalline IGZO which has a reduced electron effective mass when compared to the amorphous phase. This should in principle lead to higher electron mobilities. If scattering mechanisms are taken into account, the mobility will be lower. This is the reason why the mobility observed for amorphous IGZO films remains similar to the mobility observed for films comprising the CAAC phase.

Both phases are able to have relative moderate electron mobility in the range of 10-30 cm$^2$/Vs.

US2019024227 discloses metal oxide films including In, M, and Zn wherein M is Al, Ga, Y, or Sn aiming at improving the electron mobility. In this respect, the best film disclosed in US2019024227 is sample A3 which has an In:Ga:Zn atomic ratio of 4:2:4.1 and has been formed by deposition on a substrate at 130° C. with an argon flow rate of 90% and an oxygen flow rate of 10%.

There is however a need in the art for alternative materials having the potential to further improve electron mobility.

SUMMARY OF THE INVENTION

It is an object of the present invention to provide good films of an oxide of In, Ga, and Zn, having a spinel crystalline phase, devices comprising the same, and methods for forming the same.

The above objective is accomplished by methods, a films, and devices according to the present invention.

In a first aspect, the present invention relates to a method for forming a film of an oxide of In, Ga, and Zn, having a spinel crystalline phase, the method comprising:
  a. Providing a substrate in a chamber,
  b. Providing a sputtering target in said chamber, the target comprising an oxide of In, Ga, and Zn, wherein:
    In, Ga, and Zn represent together at least 95 at % of the elements other than oxygen,
    In represents from 0.6 to 44 at % of In, Ga, and Zn,
    Ga represents from 22% to 66 at % of In, Ga, and Zn, and
    Zn represents from 20 to 46 at % of In, Ga, and Zn,
  c. Forming a film on the substrate, the substrate being at a temperature of from 125° C. to 250° C., by sputtering the target with a sputtering gas comprising O$_2$, the sputtering being performed at a sputtering power of at least 200 W.

Theoretical calculations have led the present inventors to realize that oxides of In, Ga, and Zn in a spinel crystalline phase have a lower effective electron mass than such oxides in an amorphous or CAAC phase. This results in a higher electron mobility for spinel oxides than for CAAC or amorphous oxides. Realizing this, the present inventors have found a method for forming films of an oxide of In, Ga, and Zn, having a spinel crystalline phase. A higher electron mobility permits, for instance, to form field-effect transistors with a higher drive current, which is very advantageous for meeting the high read speed specification of direct random access memory devices.

It is an advantage of embodiments of the present invention that the film formed, due to the presence of the spinel phase, may have more uniform electron mobility than similar films having a CAAC phase instead of the spinel phase.

It is an advantage of embodiments of the present invention that the films obtained, due to the presence of the spinel phase, may be more resistant to thermally-induced phase separation than similar films without the spinel phase. This is especially true for thermally-induced phase separation in the presence of hydrogen because the films according to embodiments of the present invention may be more resistant against hydrogenation than films not comprising the spinel phase.

It is an advantage of embodiments of the present invention that the films obtained, due to the presence of the spinel phase, may be more stable under high voltage.

It is an advantage of embodiments of the present invention that a film of an oxide of In, Ga, and Zn, having a spinel crystalline phase, can be obtained without annealing with an energy beam such as a laser.

This is advantageous because a more homogeneous film can be obtained. Also, an homogeneous film can typically be obtained faster than if a laser was used. Also, since no laser light source is needed, the method can be less expensive to implement.

The film can be of any thickness. For instance, it can be from 20 to 200 nm thick. The film has a spinel phase. In embodiments, the film may further have an amorphous phase. In embodiments, the film may further have a CAAC phase. In embodiments, the film may have a spinel phase, an amorphous phase, and a CAAC phase.

In embodiments, the spinel crystalline phase may represent from 10 vol % to 100 vol % of the film. The rest of the film is typically an amorphous phase and a CAAC phase. Measuring the extent of the spinel crystalline phase in the film can be performed by Θ-2Θ (out-of-plane) XRD. Since the amorphous phase only gives a weak signal by XRD, a direct evaluation of the extent of the spinel crystalline phase is not convenient. It is preferred to use an indirect measurement method involving a crystallization of the amorphous phase before performing the XRD measurement. For this purpose, the amorphous phase may be transformed into a crystalline phase (typically an hexagonal phase) by performing an oxygen anneal at 700° C. In order to be able to interpret quantitatively the XRD results, a calibration can be performed. For this purpose, the signal intensity corresponding to a 100 vol % amorphous sample (after crystallization by an oxygen anneal at 700° C.) and the signal intensity corresponding to a 100 vol % CAAC sample are preferably measured. Finally, the $\Theta$-$2\Theta$ (out-of-plane) XRD signals of the sampled of interest (after oxygen anneal) can be compared to the calibration signals and the relative vol % of spinel crystalline phase can be determined by subtracting from 100 vol % the vol % corresponding to the crystallized amorphous phase and to the CAAC phase.

In embodiments, the spinel crystalline phase may be of the space group Fd3m. The space group Fd3m is also known as the space group 227.

The presence of the spinel crystalline phase of the space group Fd3m can be determined by the presence of peaks at $\Theta$=17.4° and 35.5o in out-of-plane XRD (see FIG. 3) and at 17.4° and 60° in grazing incidence XRD.

The presence of the CAAC in the film can be detected by out-of-plane XRD, when a broad peak in the range $\Theta$=29° to 31° appears.

The oxide formed by the method typically comprises an oxide of In, Ga, and Zn, wherein:
  In, Ga, and Zn represent together at least 95 at % of the elements other than oxygen,
  In represents from 0.6 to 44 at % of In, Ga, and Zn,
  Ga represents from 22 to 66 at % of In, Ga, and Zn, and
  Zn represents from 20 to 46 at % of In, Ga, and Zn,
Typically, the chemical composition of the oxide formed by the method is the same as the composition of the target.

In embodiments, the oxide formed by the method may comprise an oxide of In, Ga, and Zn, wherein:
  In represents from 2 to 40 at % of In, Ga, and Zn,
  Ga represents from 25 to 55 at % of In, Ga, and Zn, and
  Zn represents from 23 to 43 at % of In, Ga, and Zn.

In embodiments, the oxide formed by the method may comprise an oxide of In, Ga, and Zn, wherein:
  In represents from 10 to 40 at % of In, Ga, and Zn,
  Ga represents from 30 to 50 at % of In, Ga, and Zn, and
  Zn represents from 27 to 40 at % of In, Ga, and Zn.

In embodiments, the oxide formed by the method may comprise an oxide of In, Ga, and Zn, wherein:
  In represents from 10 to 35 at % of In, Ga, and Zn,
  Ga represents from 30 to 50 at % of In, Ga, and Zn, and
  Zn represents from 27 to 40 at % of In, Ga, and Zn.

In embodiments, the oxide formed by the method may comprise an oxide of In, Ga, and Zn, wherein:
  In represents from 30 to 35 at % of In, Ga, and Zn,
  Ga represents from 30 to 35 at % of In, Ga, and Zn, and
  Zn represents from 30 to 35 at % of In, Ga, and Zn.

In embodiments, the oxide formed by the method may comprise an oxide of In, Ga, and Zn, wherein the In, Ga, and Zn represent together at least 99 at %, preferably at least 99.9 at %, more preferably at least 99.95% of the elements other than oxygen.

In embodiments, the oxide formed by the method may consist of an oxide of In, Ga, and Zn, and usual impurities. Usual impurities may for instance be Fe, Ni and Si (e.g. in trace amounts). However, impurities are typically not detectable.

In embodiments, the oxide formed by the method may consist of an oxide of In, Ga, and Zn.

In embodiments, the ratio [In] on [Ga] in the oxide formed by the method may be from 0.01 to 2, preferably from 0.1 to 1.98, more preferably from 0.3 to 1.97, yet more preferably from 0.51 to 1.96, yet more preferably from 0.7 to 1.5, even more preferably from 0.8 to 1.2, most preferably from 0.9 to 1.1.

In embodiments, the ratio [In] on [Zn] in the oxide formed by the method may be from 0.02 to 2.2, preferably from 0.1 to 2.2, more preferably from 0.5 to 2.2, yet more preferably from 0.7 to 2.2, yet more preferably from 0.8 to 1.2, most preferably from 0.9 to 1.1.

In embodiments, the ratio [Ga] on [Zn] in the oxide formed by the method may be from 0.5 to 2.2, preferably from 0.7 to 2.2, more preferably from 0.8 to 1.2, most preferably from 0.9 to 1.1.

The substrate can be made of any material. In embodiments, the substrate may comprise a semiconductor material (e.g. Si). For instance, the substrate may be a Si wafer such as a 300 mm diameter Si wafer. In embodiments, the substrate may comprise a dielectric material (e.g. $SiO_2$). In embodiments, the substrate may comprise a semiconductor material and a dielectric material. For instance, it may comprise a semiconductor substrate on which an oxide layer is present, and the deposition may be performed on the oxide layer (e.g. $SiO_2$ on Si). The presence of the oxide layer may be due to the deposition of such a layer on the semiconductor material or may be due to the oxidation of the top surface of the semiconductor material. The presence of the oxide layer is advantageous when conductivity measurements need to be performed on the oxide of In, Ga, and Zn.

In embodiments, step a may comprise heating up the substrate so as to remove moisture adsorbed thereon. For instance, the substrate may be heated at a temperature of from 100 to 450° C., preferably from 200 to 425° C., yet more preferably from 300 to 400° C. (e.g. 350° C.) under an inert atmosphere. Ar is preferred for the inert atmosphere. The heating up step can, for instance, last from 10 s to 5 min, preferably from 20 s to 3 min, more preferably from 30 s to 2 min, yet more preferably from 45 s to 75 s (e.g. 1 min).

The chamber is typically a PVD chamber. Before step c, the chamber is typically under vacuum (e.g. from $0.5 \times 10^{-5}$ to $9 \times 10^{-5}$ (e.g. $3 \times 10^{-5}$) Torr. Placing the substrate in that chamber can, for instance, be performed by robotic handling. The chamber may comprise a chuck for electrostatically clamping and heating the substrate. The electrostatic clamping can, for instance, be caused by a bias voltage of 300 V.

The chuck may comprise channels for allowing a backside gas flow. In embodiments, the substrate may be on a chuck through which at least 0.5 sccm and preferably from 2 to 5 sccm of an inert gas (e.g. Ar) may flow to enable (proper) heat transfer.

Step b of providing the sputtering target in said chamber can be performed before, after, or simultaneously with step a.

The target comprises an oxide of In, Ga, and Zn, wherein:
  In, Ga, and Zn represent together at least 95 at % of the elements other than oxygen,
  In represents from 0.6 to 44 at % of In, Ga, and Zn,
  Ga represents from 22 to 66 at % of In, Ga, and Zn, and
  Zn represents from 20 to 46 at % of In, Ga, and Zn,
On the high side of the In range, better electron mobility can be achieved than on the lower side. On the lower side of the In range, smaller leakage currents can be achieved than on the higher side.

In embodiments, the sputtering target provided in step b may comprise an oxide of In, Ga, and Zn, wherein:
In represents from 2 to 40 at % of In, Ga, and Zn,
Ga represents from 25 to 55 at % of In, Ga, and Zn, and
Zn represents from 23 to 43 at % of In, Ga, and Zn.

In embodiments, the sputtering target provided in step b may comprise an oxide of In, Ga, and Zn, wherein:
In represents from 10 to 40 at % of In, Ga, and Zn,
Ga represents from 30 to 50 at % of In, Ga, and Zn, and
Zn represents from 27 to 40 at % of In, Ga, and Zn.

In embodiments, the sputtering target provided in step b may comprise an oxide of In, Ga, and Zn, wherein:
In represents from 10 to 35 at % of In, Ga, and Zn,
Ga represents from 30 to 50 at % of In, Ga, and Zn, and
Zn represents from 27 to 40 at % of In, Ga, and Zn.

In embodiments, the sputtering target provided in step b may comprise an oxide of In, Ga, and Zn, wherein:
In represents from 30 to 35 at % of In, Ga, and Zn,
Ga represents from 30 to 35 at % of In, Ga, and Zn, and
Zn represents from 30 to 35 at % of In, Ga, and Zn.

In embodiments, the sputtering target provided in step b may comprise an oxide of In, Ga, and Zn, wherein the In, Ga, and Zn represent together at least 99 at %, preferably at least 99.9 at %, more preferably at least 99.95% of the elements other than oxygen.

In embodiments, the sputtering target provided in step b may consist of an oxide of In, Ga, and Zn, and usual impurities. Usual impurities may for instance be Fe, Ni and Si (e.g. in trace amounts).

In embodiments, the sputtering target provided in step b may consist of an oxide of In, Ga, and Zn.

In embodiments, the ratio [In] on [Ga] in the sputtering target may be from 0.01 to 2, preferably from 0.1 to 1.98, more preferably from 0.3 to 1.97, yet more preferably from 0.51 to 1.96, yet more preferably from 0.7 to 1.5, even more preferably from 0.8 to 1.2, most preferably from 0.9 to 1.1.

In embodiments, the ratio [In] on [Zn] in the sputtering target may be from 0.02 to 2.2, preferably from 0.1 to 2.2, more preferably from 0.5 to 2.2, yet more preferably from 0.7 to 2.2, yet more preferably from 0.8 to 1.2, most preferably from 0.9 to 1.1.

In embodiments, the ratio [Ga] on [Zn] in the sputtering target may be from 0.5 to 2.2, preferably from 0.7 to 2.2, more preferably from 0.8 to 1.2, most preferably from 0.9 to 1.1.

In embodiments, the sputtering target may be polycrystalline.

The distance between the target and the substrate is not critical but a distance of from 50 to 100 nm is typically suitable.

It may be advantageous to cool the target during operation. For instance, the target may be water-cooled.

In step c, the film is formed on the substrate by sputtering the target with a sputtering gas comprising $O_2$.

Step c is typically performed under vacuum. For instance, a pressure of from 0.05 to 5 Pa may be maintained during step c.

Step c is preferably performed by pulsed DC magnetron sputtering. In embodiments, the pulsed DC reactive magnetron sputtering may be performed with a frequency of from 10 kHz to 1 MHz, e.g. from 50 to 200 kHz. Alternatively, AC magnetron sputtering can be used. In embodiments, the sputtering power may be at least 300 W, preferably at least 400 W, more preferably at least 500 W.

Either no duty on/off cycle or a duty on/off cycle can be used for operating the DC reactive magnetron sputtering. If a duty on/off cycle is used, a duty on/off cycle of from 80/20 to 95/5 (e.g. 90/10) can be used.

In embodiments, the sputtering gas may be provided at a flow of from 10 to 1000 sccm, preferably from 50 to 200 sccm, more preferably from 75 to 150 sccm.

In embodiments, the sputtering gas flow may be composed for at least 35% oxygen, preferably at least 50% oxygen, yet more preferably at least 70% oxygen, yet more preferably at least 80% oxygen, even more preferably at least 85% oxygen, yet more preferably at least 89% of oxygen. The balance, aside from oxygen, may be an inert gas or an inert gas and usual impurities. Typically, no impurities can be detected in the sputtering gas flow since the gas used can be obtained in very high purity. The inert gas is preferably Ar.

In embodiments, in step c, the substrate may be at a temperature of from 150 to 230° C., preferably from 175 to 220° C., yet more preferably from 190 to 210° C.

In a second aspect, the present invention relates to a film of an oxide of In, Ga, and Zn, having a spinel crystalline phase, wherein In, Ga, and Zn represent together at least 95 at % of the elements other than oxygen,
In represents from 0.6 to 44 at % of In, Ga, and Zn,
Ga represents from 22 to 66 at % of In, Ga, and Zn, and
Zn represents from 20 to 46 at % of In, Ga, and Zn, In embodiments, the film of the second aspect may be obtainable by any embodiment of the method of the first aspect.

Any feature of the second aspect may be as correspondingly described for the first aspect. In particular, the formed oxide may be as described in the first aspect.

In a third aspect, the present invention relates to an electronic device, such as a semiconductor device, comprising a film according to the second aspect or an element, such as a channel, obtained from patterning such a film. The semiconductor device may, for instance, be a field-effect transistor or a device comprising a field-effect transistor, itself comprising said film according to the second aspect or a channel obtained from patterning such a film. An example of such a device comprising a field-effect transistor is a Dynamic Random-Access Memory.

Any feature of the third aspect may be as correspondingly described for the second or first aspect.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DESCRIPTION OF ILLUSTRATIVE EMBODIMENTS

Figure 1A:
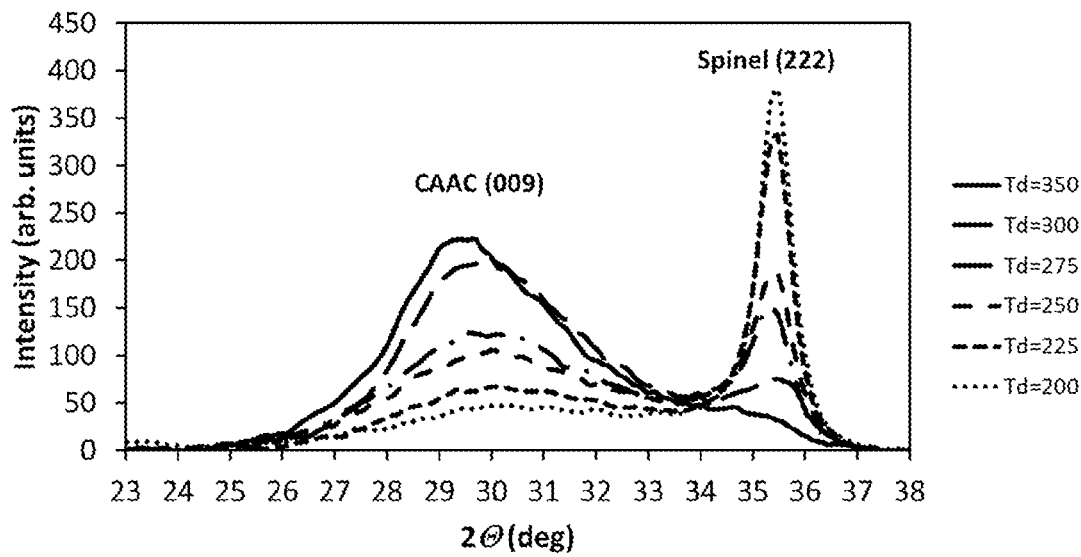
FIGS. 1A and 1B are graphs of the XRD intensity (a.u.) as a function of 2θ (deg) for different substrate temperatures during sputtering with a gas mixture $O_2$/Ar 80/20.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

All numbers including those expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Where a range of values is provided, it is understood that the upper and lower limit, and each intervening value between the upper and lower limit of the range is encompassed within the embodiments.

All references cited herein are incorporated herein by reference in their entirety. To the extent publications and patents or patent applications incorporated by reference contradict the disclosure contained in the specification, the specification is intended to supersede and/or take precedence over any such contradictory material.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures, and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

Reference will be made to transistors. These are three-terminal devices having a first main electrode such as a drain, a second main electrode such as a source and a control electrode such as a gate for controlling the flow of electrical charges between the first and second main electrodes.

Example 1: General Procedure for the Formation of a Film of an Oxide of In, Ga, and Zn To deposit thin films of an oxide of In, Ga, and Zn, 300 mm diameter Si wafers were used as the substrate. The wafers had a 100 nm thick $SiO_2$ film obtained by thermal oxidation to enable conductivity measurements. Similar results can, however, be obtained by deposition on the native oxidized Si surface. The presence of the insulating $SiO_2$ film is optional when no conductivity measurements need to be performed.

Wafers were loaded via a vacuum load lock, entering the degas chamber first to remove adsorbed moisture by lamp heating at 350° C. in Ar ambient for 60 s. Next, wafers were placed in a physical vapour deposition (PVD) chamber by robotic handling under vacuum. Inside the PVD chamber, the wafers were electrostatically clamped to a heated chuck by a bias voltage of 300 V. A backside Ar flow of 2-5 sccm through channels in the chuck enabled a good heat transfer. The wafer temperature was assumed to be same as the temperature measured and controlled by a thermocouple in the heated chuck. The temperature range for the present examples was 20-375° C. Before deposition, the chamber was evacuated to a base pressure of $3\times10^{-5}$ Torr by a cryogenic pump.

Film deposition was obtained by pulsed DC reactive magnetron sputtering with the power of 200-500 W with a pulse frequency of 100 kHz and a duty on/off cycle of 90%/10%. A 445 mm diameter IGZO disk was used as the target placed 78 mm above the wafer chuck. The IGZO disk consisted of polycrystalline $InGaZnO_4$ (purity of 99.99%) with a metal atom ratio of In:Ga:Zn=1:1:1. The target was water-cooled to avoid excessive heating. The sputtering gas is a mixture of Ar and $O_2$. The total flow, including the back-side flow is kept at 100 sccm. At this flow, the pressure is maintained at 0.5 Pa by continuous pumping via the cryogenic pump.

The obtained IGZO films have a metal composition close to that of the target. This did not depend on deposition temperature, power, or gas flow ratio. The morphology, however, was subject to change as will be shown in the examples below.

Example 1.1: Formation of a Film of an Oxide of In, Ga, and Zn at Various Temperatures Example 1 was performed at various temperatures ranging from 20° C. to 375° C. while setting the gas mixture at 20 at % Ar and 80 at % $O_2$ and using a power of 500 W.

Figure 1B:
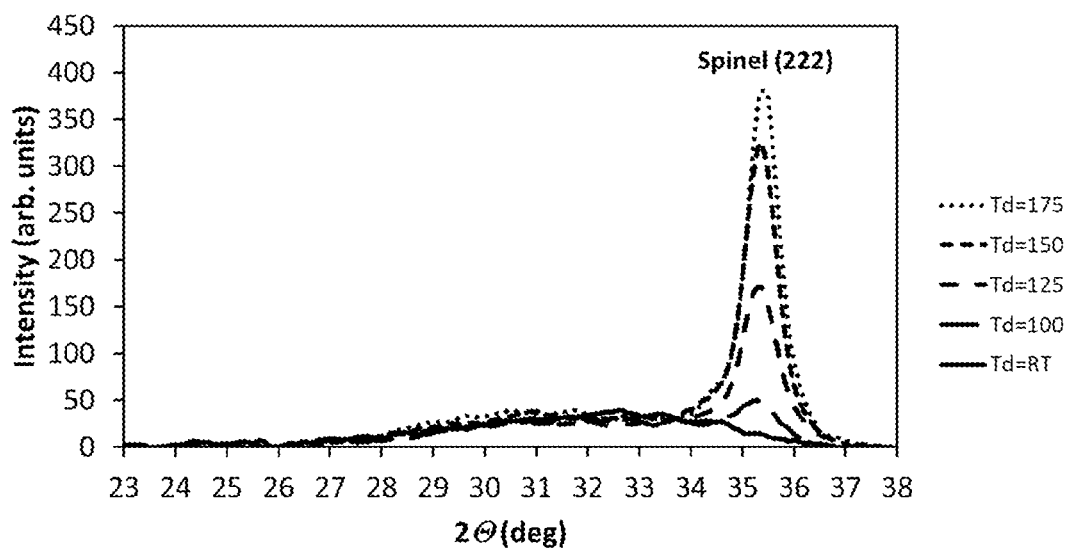
Figure 2:
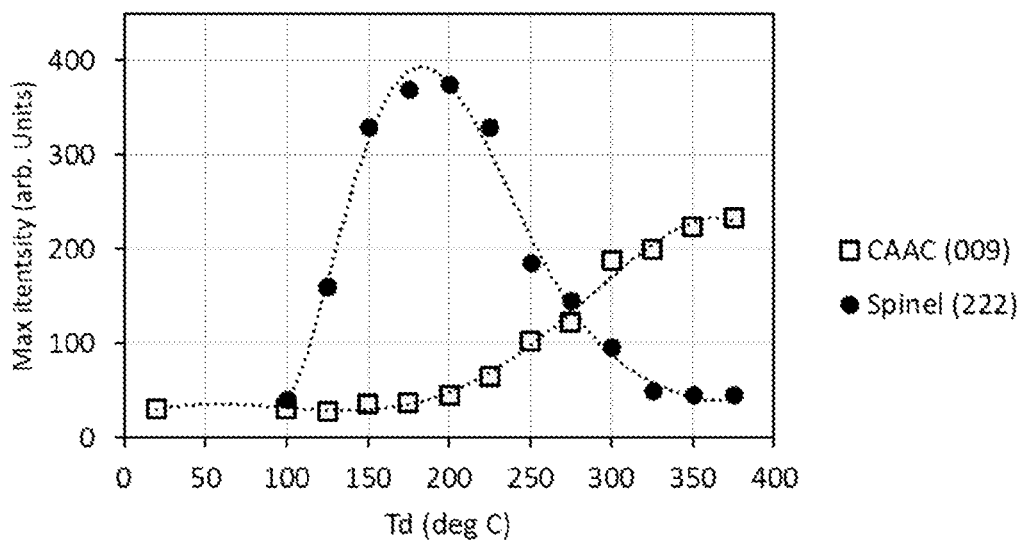
FIG. 2 is a graph plotting the maximal intensity (a.u.) observed in FIGS. 1(a) and (b) as a function of 2θ (deg).

As can be seen in FIG. 1B, at room temperature, the film was amorphous. At 100° C., a spinel Fd3m (space group 227) phase appears. This is witnessed by the appearance of peaks at $\Theta=35.5°$ in out-of-plane XRD (see FIG. 3) and at 17.4° and 60° in grazing incidence XRD (GI-XRD, incidence angle=1°, see FIG. 5) and are caused by respectively (222), (111), and (440) diffraction in the spinel structure. The peak at $\Theta=35.5°$ can be observed in FIGS. 1A and 1B. The importance of the spinel phase grows from 100° C. to between 175° C. and 200° C. where it reaches a maximum. Then, it starts to decrease while a C-axis aligned crystalline (CAAC) phase appears and grows in importance. The appearance of CAAC IGZO in the film can be detected by out-of-plane XRD, when a broad peak at $\Theta=30°$ appears. The intensity of this peak is a measure for the amount of CAAC IGZO next to amorphous IGZO and increases with increasing deposition temperature which has a stronger effect than changing the power or $O_2$-flow ratio. Above 250° C., the peak corresponding to the spinel phase is not observed anymore.

Example 1.2: Formation of a Film of an Oxide of In, Ga, and Zn in Pure Ar

Example 1 was performed at various temperatures ranging from 20° C. to 375° C. while setting the gas mixture at 100 at % Ar and 0 at % $O_2$. The power was 500 W. The film was amorphous at all temperatures

Example 1.3: Formation of a Film of an Oxide of In, Ga, and Zn in Various Oxygen Flow Ratio at 200° C.

Figure 3:
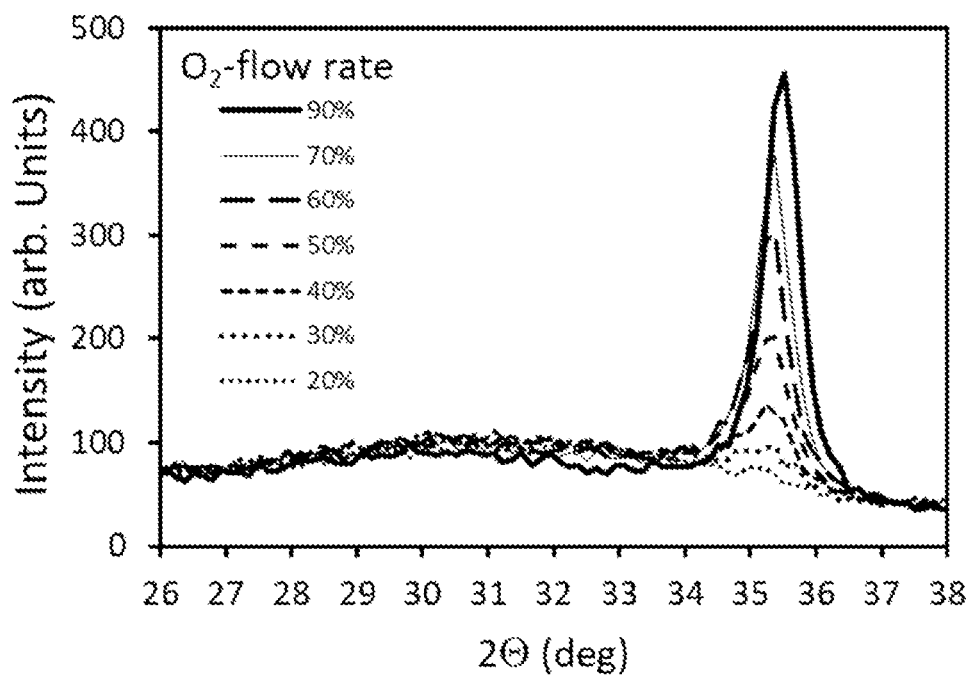
FIG. 3 is a graph of the out-of-plane XRD intensity (a.u.) as a function of 2θ (deg) for a substrate temperature of 200° C. during sputtering at 500 W with different gas mixtures.
Figure 5:
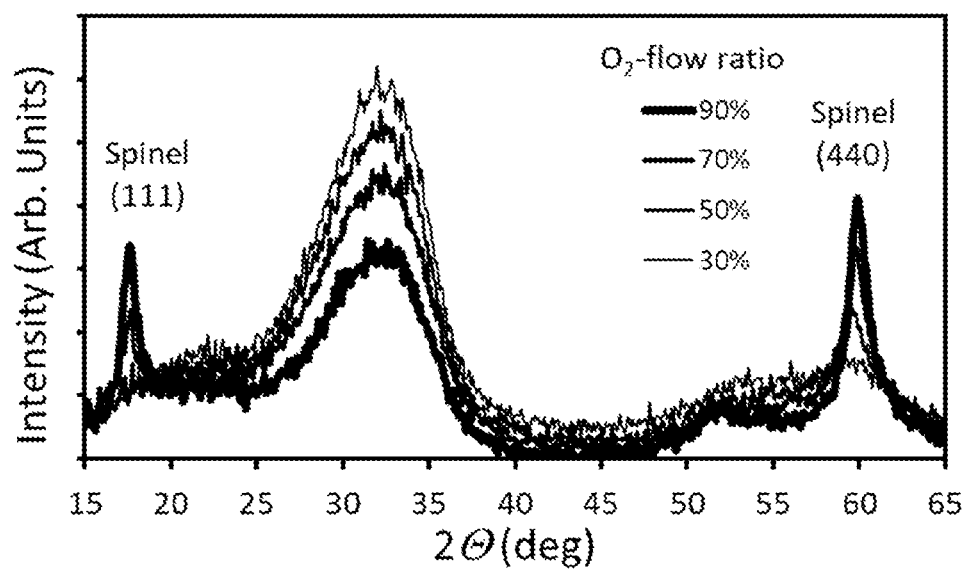
FIG. 5 is a graph of the grazing incidence XRD (1°) intensity (a.u.) as a function of 2θ (deg) for a substrate temperature of 200° C. during sputtering with different gas mixtures.

Example 1 was performed at various $O_2$ flow ratios ranging from 5 to 95% with the balance being Ar. The temperature was set at 200° C. and the power at 500 W. As can be seen in FIGS. 3 and 5, the peak at $\Theta=35.5°$ is already marginally present at an oxygen flow rate of 20% but really starts to emerge from the background between 30 and 40% $O_2$. It was observed that the higher the oxygen flow rate ratio, the more important the spinel phase becomes.

Example 1.4: Formation of a Film of an Oxide of In, Ga, and Zn in Various Oxygen Flow Ratio at 300° C.

Example 1.3 was repeated at 300° C. Instead of obtaining a spinel phase, a CAAC phase was observed. Its importance grew with the oxygen flow rate ratio.

Example 1.5: Formation of a Film of an Oxide of In, Ga, and Zn in 80 at % Oxygen Flow Ratio Above 300° C.

Example 1 was performed at 80 at % $O_2$ flow ratio with the balance being Ar. The temperature was set at 350 or 375° C. and the power at 500 W. At both temperatures, the structure was polycrystalline. Both crystalline structures were attributed to the hexagonal R3m (space group 166) unit cell.

Figure 4:
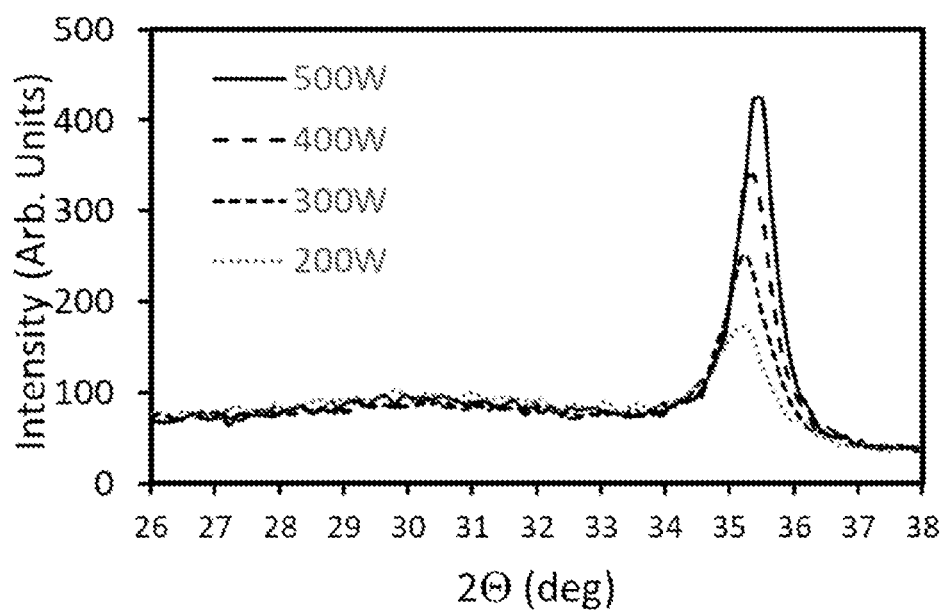
FIG. 4 is a graph of the XRD intensity (a.u.) as a function of 2θ (deg) for a substrate temperature of 200° C. during sputtering at different powers with a gas mixture $O_2$/Ar 80/20.

Example 1.6: Formation of a Film of an Oxide of In, Ga, and Zn at Different Powers Example 1 was performed at an $O_2$ flow ratio of 80% with the balance being Ar. The temperature was set at 200° C. and the power was varied between 200 W and 500 W. As can be seen in FIG. 4, the spinel phase peak at $\Theta=35.5°$ is present at all powers but gains in intensity with higher powers.

Example 1.7: Formation of a Film of an Oxide of In, Ga, and Zn with a Ratio In:Ga:Zn of 2:2:1

Example 1 is repeated while using a target having a ratio In:Ga:Zn of 4:2:3 or 2:2:1. Preliminary results lead us to conclude that the targets having a ratio In:Ga:Zn of 2:2:1 or of 1:1:1 appear more prone to form the spinel phase than the target having a ratio In:Ga:Zn of 4:2:3. So far, no target having a ratio In:Ga:Zn of 4:2:3 did form a spinel phase.

It is to be understood that although preferred embodiments, specific constructions, and configurations, as well as materials, have been discussed herein for devices according to the present invention, various changes or modifications in form and detail may be made without departing from the scope of this invention. Steps may be added or deleted to methods described within the scope of the present invention.

What is claimed is:

1. A method of forming a film of an oxide of In, Ga, and Zn, having a spinel crystalline phase, the method comprising:
   providing a substrate in a chamber;
   providing a sputtering target in the chamber, the sputtering target comprising an oxide of In, Ga, and Zn, wherein:
   In, Ga, and Zn represent together at least 95 at % of elements other than oxygen in the sputtering target,
   In represents from 0.6 to 44 at % of In, Ga, and Zn in the sputtering target, an atomic percent ratio of In to Ga in the sputtering target is from 0.51 to 1.96,
   Ga represents from 22 to 66 at % of In, Ga, and Zn in the sputtering target, and
   Zn represents from 20 to 46 at % of In, Ga, and Zn in the sputtering target; and
   forming a film on the substrate, the substrate being at a temperature of from 125° C. to 250° C., by pulsed DC reactive magnetron sputtering the sputtering target with a sputtering gas comprising $O_2$, the sputtering being performed at a sputtering power of at least 300 W and at a frequency of from 10 kHz to 1 MHz, wherein the formed film of the oxide of In, Ga, and Zn has the spinel crystalline phase.

2. The method of claim 1, wherein:
   In represents from 2 to 40 at % of In, Ga, and Zn in the sputtering target,
   Ga represents from 25 to 55 at % of In, Ga, and Zn in the sputtering target, and
   Zn represents from 23 to 43 at % of In, Ga, and Zn in the sputtering target.

3. The method of claim 2, wherein:
   In represents from 10 to 40 at % of In, Ga, and Zn in the sputtering target,
   Ga represents from 30 to 50 at % of In, Ga, and Zn in the sputtering target, and
   Zn represents from 27 to 40 at % of In, Ga, and Zn in the sputtering target.

4. The method of claim 1, wherein the In, Ga, and Zn in the sputtering target represent together at least 99 at % of elements other than oxygen in the sputtering target.

5. The method of claim 1, wherein the In, Ga, and Zn in the sputtering target represent together at least 99.9 at % of elements other than oxygen in the sputtering target.

6. The method of claim 1, wherein the In, Ga, and Zn in the sputtering target represent together at least 99.95 at % of elements other than oxygen in the sputtering target.

7. The method of claim 1, wherein an atomic percent ratio of In to Zn in the sputtering target is from 0.5 to 2.2.

8. The method of claim 1, wherein an atomic percent ratio of Ga to Zn in the sputtering target is from 0.5 to 2.2.

9. The method of claim 1, wherein the sputtering power is at least 400 W.

10. The method of claim 1, wherein the sputtering power is at least 500 W.

11. The method of claim 1, wherein a sputtering gas flow comprises at least 80% of oxygen with a balance of the sputtering gas flow comprising an inert gas.

12. The method of claim 1, wherein a sputtering gas flow comprises at least 85% of oxygen with a balance of the sputtering gas flow comprising an inert gas.

13. The method of claim 1, wherein the substrate is at a temperature of from 150 to 230° C.

14. The method of claim 1, wherein the substrate is at a temperature of from 175 to 220° C.

15. The method of claim 1, wherein the spinel crystalline phase is of a space group Fd3m.

16. The method of claim 1, wherein the substrate comprises a semiconductor material and a dielectric material disposed over the semiconductor material.

* * * * *